US008383189B2

(12) United States Patent
Lang

(10) Patent No.: US 8,383,189 B2
(45) Date of Patent: Feb. 26, 2013

(54) SELECTABLE GLOSS COATING SYSTEM

(75) Inventor: Joseph Herman Lang, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/106,461

(22) Filed: Apr. 21, 2008

(65) Prior Publication Data

US 2009/0262159 A1 Oct. 22, 2009

(51) Int. Cl.
*C23C 16/52* (2006.01)

(52) U.S. Cl. ......... 427/8; 427/412.1; 427/424; 427/427; 427/427.6

(58) Field of Classification Search ........... 427/8, 412.1, 427/424, 427, 427.6, 15
See application file for complete search history.

(56) References Cited

U.S. PATENT DOCUMENTS 6,993,272 B2 1/2006 Lange et al.
7,152,950 B2 * 12/2006 Takekoshi et al. .............. 347/43
7,301,675 B2 11/2007 Wang et al.
7,304,770 B2 12/2007 Wang et al.
7,305,200 B2 12/2007 Hoffman et al.
7,324,241 B2 1/2008 Eschbach et al.
2005/0007416 A1 1/2005 Takekoshi et al.
2005/0128523 A1 6/2005 Liu et al.

FOREIGN PATENT DOCUMENTS

JP 2007268843 A * 10/2007

OTHER PUBLICATIONS

EP Search Report corresponding to European Patent Application 09158301.3, European Patent Office, Munich Germany, Aug. 14, 2012 (7 pages).

* cited by examiner

*Primary Examiner* — Nadine Norton
*Assistant Examiner* — Mahmoud Dahimene
(74) *Attorney, Agent, or Firm* — Maginot, Moore & Beck, LLP

(57) ABSTRACT

A coating system comprises a high gloss coating ink supply source, and a low gloss coating ink supply source. The system includes a coating module configured to receive the high gloss coating ink and the low gloss coating ink. The coating module includes a first and second group of nozzles configured to emit the high gloss and low gloss coating inks, respectively. The coating system has a controller that is configured to selectively actuate the first group and second group of inkjet nozzles to deposit the high gloss and low gloss coating inks onto the image receiving surface in accordance with a halftone pattern to form a gloss coating, the halftone pattern specifying a halftone density for the high gloss coating ink and for the low gloss coating ink, the halftone densities of the high and low gloss coating inks corresponding to a gloss level for the gloss coating.

11 Claims, 4 Drawing Sheets

| | | | |
|---|---|---|---|
| 1 | 1 | 1 | 1 |
| 1 | 1 | 1 | 1 |
| 1 | 1 | 1 | 1 |
| 1 | 1 | 1 | 1 |

FIG. 4A

| | | | |
|---|---|---|---|
| 0 | 0 | 0 | 0 |
| 0 | 0 | 0 | 0 |
| 0 | 0 | 0 | 0 |
| 0 | 0 | 0 | 0 |

FIG. 4B

| | | | |
|---|---|---|---|
| 1 | 0 | 1 | 0 |
| 0 | 1 | 0 | 1 |
| 1 | 0 | 1 | 0 |
| 0 | 1 | 0 | 1 |

FIG. 4C

| | | | |
|---|---|---|---|
| 1 | 1 | 1 | 0 |
| 1 | 0 | 1 | 1 |
| 1 | 1 | 0 | 1 |
| 0 | 1 | 1 | 1 |

FIG. 5A

| | | | |
|---|---|---|---|
| 0 | 0 | 0 | 1 |
| 0 | 1 | 0 | 0 |
| 0 | 0 | 1 | 0 |
| 1 | 0 | 0 | 0 |

FIG. 5B

SELECTABLE GLOSS COATING SYSTEM

TECHNICAL FIELD

This disclosure relates generally to inkjet printers, and, in particular, to inkjet printers that use coating inks.

BACKGROUND

In general, inkjet printing machines or printers include at least one printhead unit that ejects drops or jets of liquid ink onto an image receiving surface such as an image substrate. A phase change inkjet printer employs phase change inks that are in the solid phase at ambient temperature, but transition to a liquid phase at an elevated temperature. The melted ink can then be ejected as drops or jets by a printhead assembly onto a heated image substrate. In some printers, the image receiving surface is a recording media, in which case the ink is ejected directly onto the image substrate. In other printers, the image receiving surface is an intermediate transfer surface onto which ink is ejected and subsequently transferred to a recording media.

One issue faced in inkjet printing technology is controlling the gloss level of all or parts of an image, page, or print job. Gloss is a measure of the reflective properties of a surface. High gloss indicates that the surface reflections are mirror-like or specular, which means the angle of reflection closely matches the angle of incidence of light illuminating the surface. Low gloss indicates that the surface produces diffuse reflections where incident light is scattered over a broad range of angles during reflection. Gloss levels may be influenced by both the type of colorant as well as the type of media used to form a printed image. Controlling gloss levels of a printed image may be difficult because ejected ink has a gloss level that differs from the gloss level exhibited by unprinted media. In addition, variations in the density of the ink ejected onto the media to form an image may cause corresponding variations in the gloss level of the image. These variations in gloss levels across a printed image may not be acceptable to consumers.

One method that has been used to control gloss levels of printed images is to coat the entire printed media with a colorless coating material that is designed to provide a protective layer on the printed media as well as to provide a substantially uniform gloss to the printed media. There are many types of coating materials that may be used. For example, coating inks have been developed that are capable of being jetted using standard printheads. The composition of these coating inks can be adjusted to provide substantially any level of gloss to a printed image such as high gloss, matte, satin, etc.

In some cases, consumers may desire to be able to select and print specific gloss levels to all or part of a printed image, page or print job. The various gloss levels, e.g., high gloss, semi-gloss, matte, etc., may each have characteristics that are desired for various printing applications. For example, color images having a high gloss level may have more vibrant colors than color images having a lower gloss level. Similarly, printed text having a low gloss level may be easier to read than printed text having a high gloss level. By selectively varying the gloss level across the printed media, different areas of the printed media may be enhanced and/or contrasted to produce aesthetically striking results.

Most previously known printers, however, are capable of providing only a single gloss finish to printed images, e.g., a high gloss finish. Some printers have been developed that are capable of providing multiple gloss finishes to printed images. In order to provide the multiple gloss levels in these systems, however, a separate coating ink is typically provided for each desired gloss level. Because coating inks having different gloss levels are typically manufactured at an off-site location, supplies of each desired gloss coating ink may have to be ordered well in advance of their actual use. In addition, customers may be required to order quantities of the different gloss inks from the supplier greater than they need.

SUMMARY

A coating system for use in an inkjet imaging device has been developed that is capable of delivering multiple selectable gloss coatings from a preloaded high gloss coating ink and a low gloss coating ink by dithering or halftoning the high and low gloss inks to form intermediate gloss coatings. The coating system includes a high gloss coating ink supply source for supplying a clear high gloss coating ink having a first gloss level; and a low gloss coating ink supply source for supplying a clear low gloss coating ink having a second gloss level, the second gloss level being less than the first gloss level. A first group of inkjet nozzles is operably connected to the high gloss coating ink supply source to receive the high gloss coating ink and to eject drops of the high gloss coating ink onto an image receiving surface; and a second group of inkjet nozzles operably connected to the low gloss coating ink supply source to receive the low gloss coating ink and to eject drops of the low gloss coating ink onto the image receiving surface. A controller is configured to generate driving signals for the first group and second group of inkjet nozzles to cause the nozzles to eject the high gloss and low gloss coating inks onto the image receiving surface in accordance with a halftone pattern to form a gloss coating on the image receiving surface. The halftone pattern specifies a halftone density for the high gloss coating ink and a halftone density for the low gloss coating ink to be deposited on the image receiving surface. The halftone densities of the high and low gloss coating inks correspond to a gloss level for the gloss coating.

In another embodiment, an ink jet imaging device is provided. The inkjet imaging device includes an image receiving surface; a plurality of colored ink supply sources, each colored ink supply source being configured to supply a different color of ink; and a printhead operably connected to at least one colored ink supply sources, the printhead being positioned to emit the colored ink received from the at least one colored ink supply source onto the image receiving surface. The imaging device also includes a high gloss coating ink supply source for supplying a high gloss coating ink having a first gloss level, and a low gloss coating ink supply source for supplying a low gloss coating ink having a second gloss level. A coating module is configured to receive the high gloss coating ink and the low gloss coating ink from the a high gloss coating ink supply source and the low gloss coating ink supply source, respectively. The coating module includes a first group of inkjet nozzles configured to emit the high gloss coating ink onto the image receiving surface; and a second group of inkjet nozzles configured to emit the low gloss coating ink onto the image receiving surface. The coating module includes a first group of inkjet nozzles configured to eject the high gloss coating ink onto the image receiving surface; and a second group of inkjet nozzles configured to eject the low gloss coating ink onto the image receiving surface. A controller is configured to selectively actuate the first group and second group of inkjet nozzles to deposit the high gloss and low gloss coating inks onto the image receiving surface in accordance with a halftone pattern to form a gloss coating on the image receiving surface. The halftone pattern specifies a halftone density for the high gloss coating ink and a halftone density for the low gloss coating ink to be deposited on the image receiving surface. The halftone densities of the high and low gloss coating inks correspond to a gloss level for the gloss coating.

In yet another embodiment, a method of operating an inkjet imaging device is provided. The method comprises supplying a high gloss coating ink having a first gloss level to a first group of inkjet nozzles and supplying a low gloss coating ink having a second gloss level to a second group of inkjet nozzles, the second gloss level being less than the first gloss level The first and second groups of nozzles are selectively actuated to deposit the high gloss and low gloss coating inks onto an image receiving surface in accordance with a halftone pattern to form a gloss coating on the image receiving surface. The halftone pattern specifies a halftone density for the high gloss coating ink and a halftone density for the low gloss coating ink to be deposited on the image receiving surface. The halftone densities of the high and low gloss coating inks correspond to a gloss level for the gloss coating.

BRIEF DESCRIPTION OF THE DRAWINGS

The foregoing aspects and other features of this disclosure are explained in the following description, taken in connection with the accompanying drawings, wherein:

FIG. 4A is an exemplary halftone cell for generating a high gloss coating.

FIG. 4B is an exemplary halftone cell for generating a low gloss coating.

FIG. 4C is an exemplary halftone cell for generating an intermediate gloss coating.

FIG. 5A is another exemplary halftone cell for generating an intermediate gloss coating.

FIG. 5B is another exemplary halftone cell halftone cell for generating an intermediate gloss coating.

DETAILED DESCRIPTION

Figure 1:
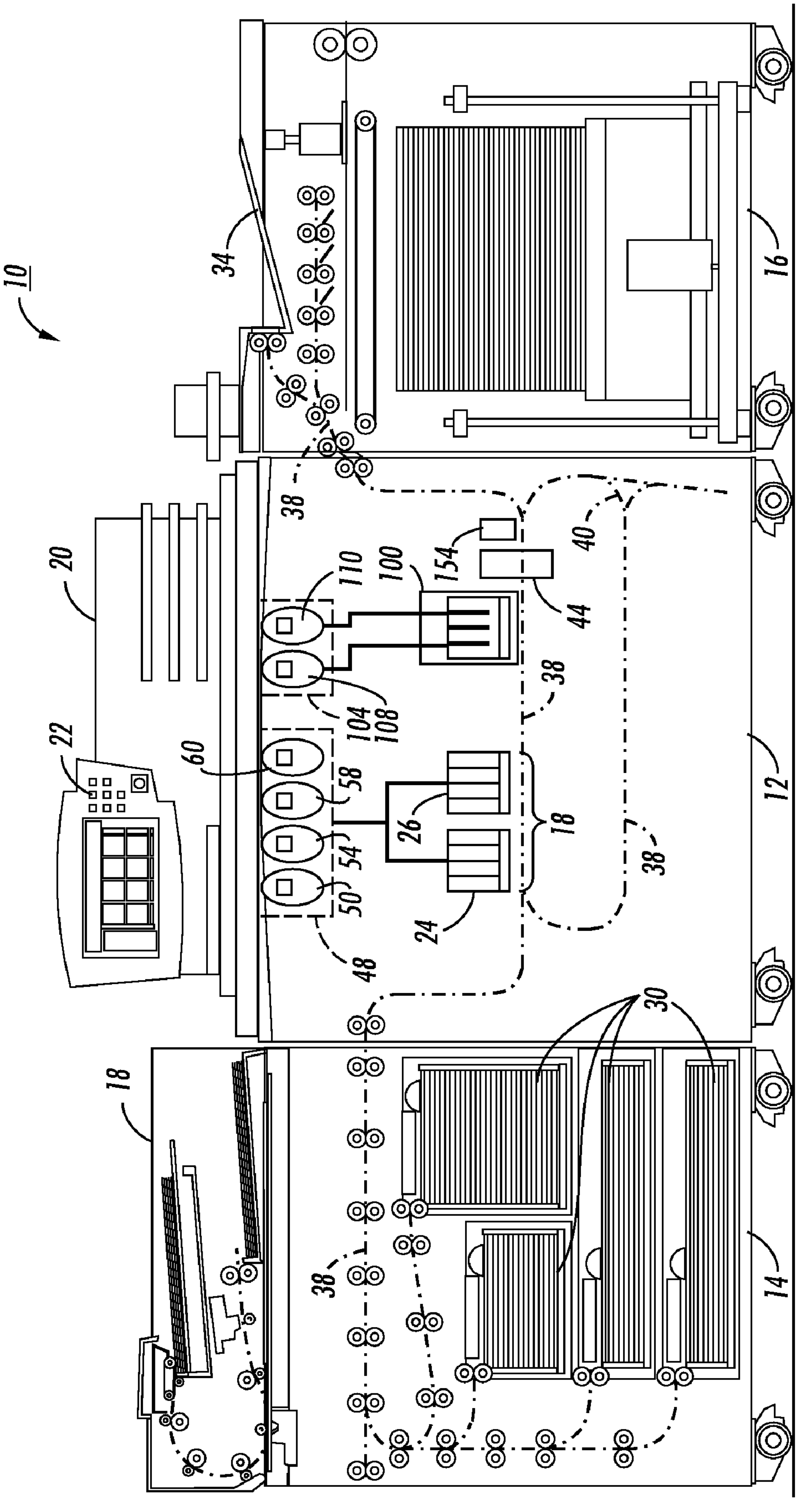
FIG. 1 is a block diagram of a phase change imaging device that includes a coating system.

For a general understanding of the present embodiments, reference is made to the drawings. In the drawings, like reference numerals have been used throughout to designate like elements.

As used herein, the term "imaging device" generally refers to a device for applying an image to print media. "Print media" or "recording media" can be a physical sheet of paper, plastic, or other suitable physical print media substrate for images, whether precut or web fed. The imaging device may include a variety of other components, such as finishers, paper feeders, and the like, and may be embodied as a copier, printer, or a multifunction machine. A "print job" or "document" is normally a set of related sheets, usually one or more collated copy sets copied from a set of original print job sheets or electronic document page images, from a particular user, or otherwise related. An image generally may include information in electronic form which is to be rendered on the print media by the marking engine and may include text, graphics, pictures, and the like.

As used herein, the terms "gloss" generally refers to the capacity of a surface to reflect more light in the specular direction as compared to other directions. Gloss level is a measurement of the degree of specular reflectance of a surface. Gloss levels may be measured with a conventional gloss meter, such as a Gardner gloss meter. Gloss meters direct light at a specific angle toward a surface and measures the degree of reflectance. The type of surface to be measured determines the gloss meter angle to be used. Typical angles of incidence of the light directed at a surface to measure the gloss level include 20 degrees, 30 degrees, 45 degrees, 60 degrees, 75 degrees and 80 degrees, etc.

FIG. 1 depicts an embodiment of a phase change inkjet imaging device 10 that is capable of providing multiple selectable gloss coatings to printed images. In particular, the exemplary imaging device includes a print station 12 having two printhead modules 24, 26 for emitting ink onto print media to form images. The print station 12 also includes a coating system 100 for providing a customer selectable coating to printed media. As explained in more detail below, the coating system 100 includes a high gloss ink and a low gloss ink for providing a high gloss coating and a low gloss coating, respectively. The coating system 100 is configured to produce selectable intermediate gloss level coatings by dithering or halftoning the high gloss and low gloss inks to produce a desired level of gloss.

The print station 12 is interposed between a feeder module 14 and a finishing module 16. The print station 12 is fed with print media from the feeder module 14 as is known in the art. For example, the feeder module 14 may include a plurality of print media sources such as trays 30. Each feeder tray 30, may include print media having different attributes such as roughness, coats, weights, and the like. The print media may be substantially any type of media upon which the printhead modules may print, such as: high quality bond paper, lower quality "copy" paper, overhead transparency sheets, high gloss paper, etc. In alternative embodiments, the printer 10 may be a web printer in which a web originates at the feeder module 14, passes through the print station, and is collected at the finisher module 16. The web may be pulled from a supply roller by a take-up roller or other tensioning device in the finishing module 16.

The finisher module 16 receives the print media from the print station 12. The term "finisher" or "finishing module" as broadly used herein in connection with the exemplary embodiment or embodiments disclosed herein, is any post-printing accessory device such as an inverter, reverter, sorter, mailbox, inserter, interposer, folder, stapler, collator, stitcher, binder, over-printer, envelope stuffer, postage machine, output tray, or the like. In the illustrated embodiment, the finisher module 16 includes an output tray 34 to which received print media sheets can be delivered. The finisher module 16 may be configured to provide various finishes to the print media sheets in a print job or jobs. Finishes can include, for example, patterns of collation, binding or stapling available by the finisher module. Additional, advanced finishes can include, for example, other binding techniques, shrink wrapping, various folding formats, etc. The finisher module 16 can also be provided with multiple output trays (not shown) and the ability to deliver specified print media sheets to a selected output tray or trays.

A print media transporting system links the feeder module 14, print station 12, and finisher module 16. The print media transporting system includes a network of media pathways 38 for guiding the movement of the print media through the imaging device 10. The print media transporting system may comprise drive members, such as pairs of rollers, spherical nips, airjets, or the like. The transport system may further include associated motors for the drive members, belts, guide rods, frames, etc. (not shown), which, in combination with the drive members, serve to convey the print media along selected pathways at selected speeds. In the illustrated embodiment, the print media from the source 14 is delivered to the print station 12 by a pathway which is common to the trays 30. The print media is printed on by the printhead modules of the print station 12 that are arranged along the media pathway 38. The pathway 38 also conveys the printed media to the finisher 38.

The print station 12 may also include a fixing assembly 44 for fixing the emitted ink drops, or image, to the web. The fixing assembly 44 may be any suitable type of device or apparatus, as is known in the art, which is capable of fixing the image to the media. The type of fixing assembly is dependent upon the type(s) of ink that are used in the imaging device. For example, in solid ink embodiments, the fixing assembly may comprise a pair fixing rollers (not shown) that are positioned in relation to each other to form a nip through which the media is fed. The ink drops on the media are pressed into the media and spread out on the media by the pressure formed by the nip. For aqueous inks, the fixing assembly may include a dryer or heater for applying heat to the printed ink in order to fix the ink to the media. In embodiments in which UV curable inks are used, the fixing assembly may include a UV lamp for applying ultraviolet radiation to the printed ink.

With continued reference to FIG. 1, the print station 12 includes multiple printhead modules 24, 26 for emitting ink onto the print media in accordance with the image data. In the embodiment of FIG. 1, print station is configured to implement a solid ink printing process to print images onto the print media. Accordingly, the printhead modules of the print station are configured as phase change ink, or solid ink, printhead modules. Each printhead module is appropriately supported adjacent the media pathway for emitting drops of ink directly onto the print media as the media moves through the print zone 18. In alternative embodiments, the printhead assembly may be configured to emit drops onto an intermediate transfer member (not shown), such as a drum or belt, for subsequent transfer to the media.

Ink is supplied to the printhead modules from the solid ink supply 48. Since the phase change ink imaging device 10 is a multicolor device, the ink supply 48 includes a plurality of solid ink sources 50, 54, 58, 60, each of which is each configured to supply a different color of ink to the printhead modules 24, 26. In one embodiment, each solid ink source 50, 54, 58, 60 of the solid ink supply comprises a dedicated channel for loading, feeding, and melting solid ink sticks of a particular color. In particular, the respective ink channels 50, 54, 58, 60 guide the appropriate colored solid ink sticks to a melting and control assembly or apparatus (not shown) for melting the ink from a solid form ink into a liquid form, and then supplying the liquid ink to the printhead modules.

The solid ink sticks utilized in the imaging device may be standard colors (e.g., cyan, magenta, yellow, or black). For example, in the embodiment of FIG. 1, the solid ink supply 48 includes four sources representing the four CMYK colors (cyan, yellow, magenta, black) of solid ink. The system, however, may be adapted for a higher or lower number of different colored solid inks. For example, the imaging device may be configured with an expanded color gamut that includes solid inks of other colors in addition to the CMYK colors. In this embodiment, the solid ink supply includes solid ink sources (not shown) for supplying, for example, light cyan, light magenta, orange, and green although any color may be used. In addition, although not depicted in FIG. 1, the imaging device may include solid ink sources for supplying premixed custom color ink, which may be substantially any color. Any suitable number of solid ink sources and/or combinations of different colors of ink (e.g., standard CMYK, expanded gamut colors, or premixed colors) may be utilized in the imaging device 10. The total number of different colors and combination of colors of solid ink made available in the system 10 may be dependent upon the overall number and range of colors desired to be printed.

Each printhead module 24, 26 is configured to receive at least one of the colors of ink from the solid ink supply and to emit the ink onto the media. Accordingly, each printhead module 24, 26 includes at least one printhead having a plurality of inkjet nozzles for ejecting the ink received from the solid ink supply. The ink may be ejected from the inkjet nozzles in any suitable manner. In one embodiment, each inkjet includes a piezoelectric transducer bonded to a thin diaphragm that may be excited with an electrical signal to cause the transducer to expand and displace ink from a pressure chamber. The controller 20 may be configured to generate driving signals in accordance with image data to cause the inkjets of the printhead modules to expel ink from the inkjets to form an image on the print media.

In the embodiment of FIG. 1, there is depicted a CMYK printhead module 24 and an expanded color gamut printhead module 26. The CMYK printhead module, as is known in the art, includes a printhead for each of the CMYK colors, i.e., a printhead for emitting cyan ink, a printhead for emitting magenta ink, a printhead for emitting yellow ink and a printhead for emitting black ink. Similarly, the expanded color gamut printhead module includes a printhead for each of the colors in the expanded color gamut, e.g., a printhead for emitting light cyan ink, a printhead for emitting light magenta ink, a printhead for emitting orange ink and a printhead for emitting green ink. Although, the CMYK printhead module and expanded color gamut printhead module have been described as having a separate printhead for each color of ink, other arrangements are contemplated. For example, each printhead module may comprise a single printhead having a dedicated array of inkjet nozzles for ejecting each color of ink received from the solid ink supply, i.e., an array of nozzles for ejecting cyan ink, an array of nozzles for ejecting magenta ink, etc. Alternatively, there may be a separate printhead module for each color of ink utilized in the imaging device. For example, there may be a cyan printhead module, a magenta printhead module, a yellow printhead module, etc.

The printheads utilized in the printhead modules may have any suitable configuration such as page-width array, partial page-width array, and carriage type printheads For example, a printhead module may have at least one page-width array printhead for each color of ink associated with the printhead module. In another embodiment, a printhead module may have a plurality of partial-width array printheads for each color associated with the printhead. The plurality of partial-width array printheads are arranged end-to-end in a straight line or staggered formation for spanning the media pathway of the imaging device. In yet another embodiment, the printhead modules may be mounted on a carriage or similar support structure so that the printheads of the printhead module may be moved with respect to the media. As can be determined by one of ordinary skill in the art, a plurality of possible arrangements and configurations for the printheads of the printhead modules are possible and are contemplated within the scope of this disclosure.

Operation and control of the various subsystems, components and functions of the machine or printer 10 are performed with the aid of a controller 20. The controller 20, for example, may be implemented as hardware, software, firmware or any combination thereof. The controller includes a user interface 22 and electronic storage (not shown). The electronic storage may store data necessary for the controller such as, for example, the image data, component control protocols, etc. The electronic storage may be a non-volatile memory such as a read only memory (ROM) or a programmable non-volatile memory such as an EEPROM or flash memory. Of course, the electronic storage may be incorporated into the inkjet printer, or may be externally located. The user interface 22 enables an operator to control and monitor various operator adjustable functions and maintenance activities of the imaging device. The operator may actuate the appropriate keys of the user interface to adjust the parameters of print operations. The user interface may be a touch screen, or any other suitable control panel, providing an operator interface with the system.

During operations, the controller 20 receives image data from an image data source. The image data source may be any one of a number of different sources, such as a scanner, a digital copier, a facsimile device that is suitable for generating electronic image data, or a device suitable for storing and/or transmitting electronic image data, such as a client or server of a network, or the Internet. The controller 20, upon receiving the image data, generates driving signals to excite the inkjets of the printhead modules to eject ink onto the print media to produce an image in accordance with the image data received from the image source.

Once an image has been formed on a print media by the printhead modules, the printed media is advanced past a coating system 100 which is configured to apply a selectable gloss coating to all or a portion of a printed media as it travels along the media pathway. The coating system 100 is configured to apply a high gloss coating, a low gloss coating, and at least one intermediate gloss coating to the print media or localized areas of the print media.

Figure 2:
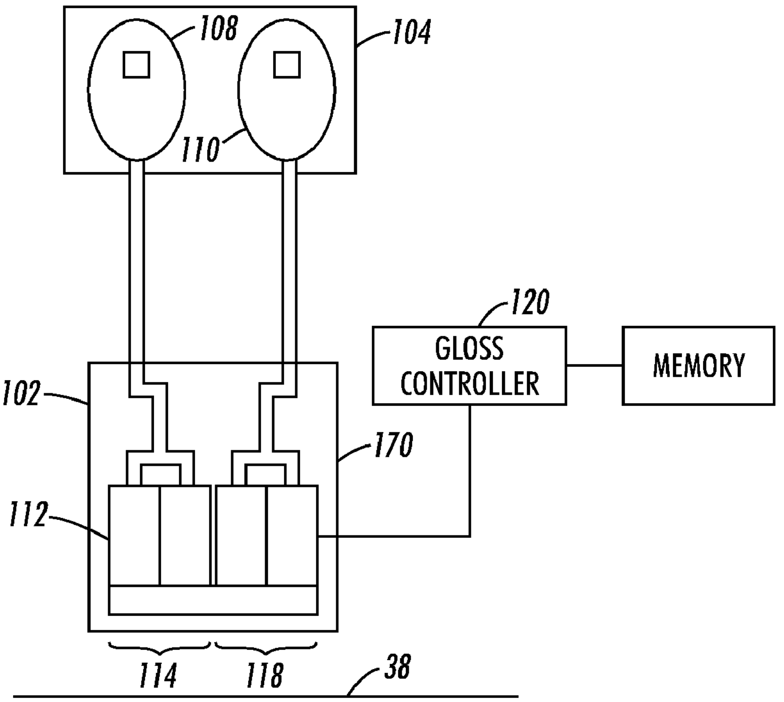
FIG. 2 is a block diagram of one embodiment of the coating system of FIG. 1.
Figure 3:
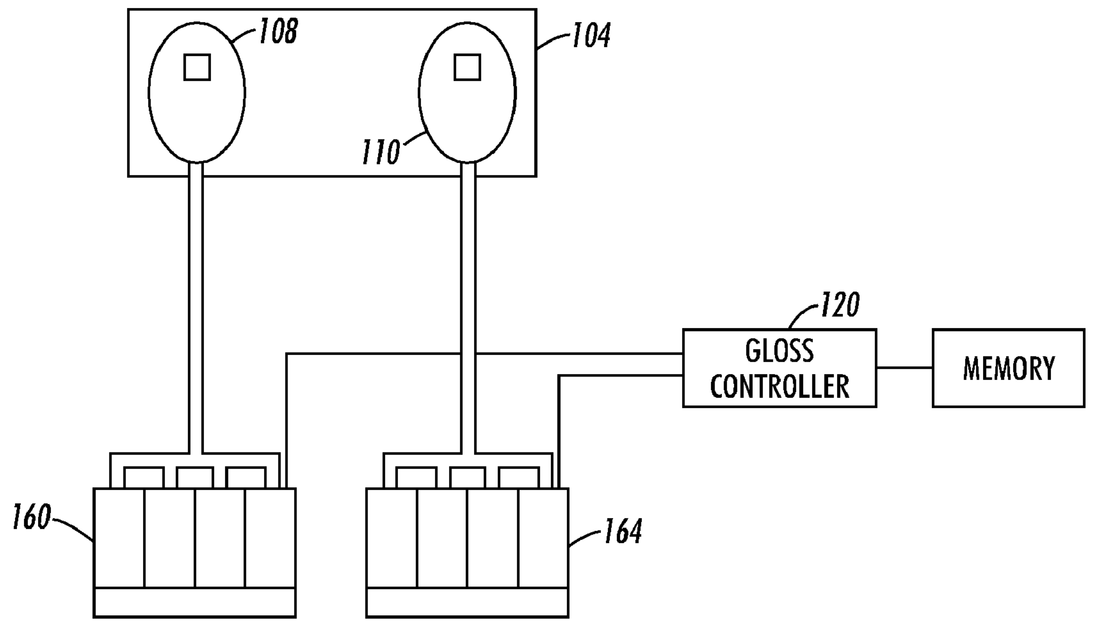
FIG. 3 is a block diagram of another embodiment of the coating system of FIG. 1.

With reference to FIGS. 1 and 2, the coating system has a gloss controller 120, a coating ink supply source 104 and a coating module 102. The coating ink supply source 104 is configured to supply at least two colorless coating inks to the coating module, each coating ink being configured to provide a different gloss level to a printed image. In the embodiment of FIGS. 1 and 2, the coating ink supply source 104 is configured to supply a high gloss coating ink 108 and a low gloss coating ink 110. The coating module includes a printhead 112 having a plurality of inkjet nozzles 114 for emitting the high gloss ink and a plurality of inkjet nozzles 118 for emitting the low gloss ink. The printhead used in the coating system may be similar or identical to the type of printhead that is used to eject the colored ink. In alternative embodiments, the coating system may include a separate printhead for emitting each of the high, low and intermediate gloss coating inks. For example, FIG. 3 shows an alternative embodiment of the coating system which includes a high gloss printhead 160, and a low gloss printhead 164. The gloss controller 120 is configured to generate driving signals to excite the inkjets of the printhead(s) of the coating system 100 to eject the high gloss and/or low gloss coating inks from the inkjets to form a coating on the print media.

The high and low gloss coating inks may have any suitable composition that is capable of producing the desired gloss level. In application, although not necessary, the coating inks may be printed with the same type of printheads that are used for the colored ink. In one embodiment, the coating inks comprise a curable ink, such as UV curable inks or Hybrid UV curable inks. Any suitable type of ink, however, may be used including solid inks, aqueous inks, etc. The high and low gloss coating inks may each have substantially the same composition except that the low gloss coating ink may include flatting or dulling agents, as are known in the art, to reduce the gloss level of the low gloss coating ink. Flatting agents, such as silica, barytes, diatomaceous earth, and heavy metal soaps, are finely divided particulate materials of irregular shape that tend to dull the surface appearance of the cured coating by dispersing incident light rays.

The coating system 100 is configured to apply a high gloss coating, a low gloss coating and at least one intermediate gloss coating to the printed media or to localized areas of the printed media using only the high gloss and low gloss coating inks that are provided in the coating system. The high gloss coating ink provides a glossy finish to all or parts of a printed image, page, job, etc. The low gloss coating ink provides a low gloss, e.g., matte, finish to all or parts of a printed image, page, job, etc. The high and low gloss levels may be any suitable level. For example, in one embodiment, the high gloss level may be approximately 80-95 gloss units while the low gloss level may be approximately 0-20 gloss units, although the gloss levels for the respective coating inks may be any suitable level. The term “intermediate gloss,” as used herein, may generally refer to any gloss level that is between the high gloss level and the low gloss level provided by the high gloss coating ink and the low gloss coating ink, respectively. For example, in one embodiment, the intermediate gloss level may be any value between approximately 20 and 80 gloss units.

The coating system is configured to apply the high, low and intermediate gloss coatings by dithering or halftoning the high gloss and low gloss coating inks. The image receiving surface of the print media is made up of a grid-like pattern of potential drop locations, sometimes referred to as pixels. Halftoning enables intermediate gloss coatings to be delivered by selectively depositing drops of either the high gloss ink or the low gloss ink at each pixel location on the image receiving surface or localized areas of the image receiving surface. The percentage or fraction of the pixels that receive the high gloss ink versus the low gloss ink determines the apparent gloss level of the coating.

In one embodiment, the gloss controller 120 is configured to implement a halftone technique in which a gloss coating having a desired gloss level is generated in accordance with an array of halftone cells. Each halftone cell may have a fixed size, and is defined by a matrix of addressable points, i.e., pixels, that may be selectively turned “on” or “off” in a digital manner to form various halftone patterns. The term “point,” as used in this description, refers to a location in a two-dimensional matrix, addressable, for example, by a pair of matrix coordinates. The gloss controller is configured to actuate the inkjet nozzles of the printhead to deposit drops or dots of the high gloss coating ink onto the points that have been turned “on” in the halftone cell and to deposit drops or dots of the low gloss coating ink onto locations that have been turned “off” in the halftone cell.

FIGS. 4A-4C depict embodiments of halftone cells for use in halftoning the gloss coatings. A halftone cell forms part of an overall halftone gloss image, and includes a plurality of addressable points, or pixels. The halftone cells of FIGS. 4A-4C are characterized, for purposes of this description, by a square, four-by-four matrix of points. However, the structure of the halftone cells may be subject to several variations, as determined by the requirements of particular printing applications. For example, the addressability of a halftone cell may be changed to increase or decrease the number of points available within the cell. In addition, the cells may have any suitable shape other than the square shape depicted in FIGS. 4A-4C such as rectangular.

FIGS. 4A and 4B depict exemplary halftone cells that may be used to generate a high gloss coating and a low gloss coating, respectively. To apply a high gloss coating to the image receiving surface or localized areas of the surface, each point, or pixel, in the halftone cell of FIG. 4A is set to "1" (i.e., turned "on") so that substantially 100% coverage or density of the high gloss coating ink is applied at desired areas of the image receiving surface. Similarly, to apply a low gloss coating to the image receiving surface or localized areas of the surface, each point, or pixel, in the halftone cell of FIG. 4B is set to "0" (i.e., turned "off") so that substantially 100% coverage or density of the low gloss coating ink is applied at desired areas of the image receiving surface.

Variations in gloss level may be achieved by selectively turning "on" and turning "off" the points in a halftone cell so that a halftone pattern high gloss points and low gloss points results. The pattern of high gloss points and low gloss points may be spatially averaged by the human eye giving the impression of an intermediate gloss level between the high gloss and low gloss levels of the coating inks. The fraction or percentage of the points that are turned on and/or off corresponds to the apparent gloss level of the halftone cell. For example, FIG. 4C depicts a halftone cell that may be used to generate an intermediate gloss coating comprised of approximately 50% high gloss ink and 50% low gloss ink. As can be seen in FIG. 4C, the points of the halftone cell are alternated from "1" to "0" in a checkerboard pattern.

To increase the apparent gloss level of a halftone cell, the percentage or fraction of the points in the halftone cell that are to receive high gloss drops or dots may be increased with a corresponding decrease in the percentage or fraction of the points in the halftone cell that are to receive low gloss drops or dots. Similarly, to decrease the apparent gloss level of a halftone cell, the percentage or fraction of the points in the halftone cell that are to receive high gloss drops or dots may be decreased with a corresponding increase in the percentage or fraction of the points in the halftone cell that are to receive low gloss drops or dots. For example, referring now to FIGS. 5A and 5B, there is depicted halftone cells that are designed to generate two different intermediate gloss coatings FIG. 5A depicts a halftone cell that may be used to generate an intermediate gloss coating comprised of approximately 75% high gloss ink and 25% low gloss ink, and FIG. 5B depicts a halftone cell that may be used to generate an intermediate gloss coating comprised of approximately 25% high gloss ink and 75% low gloss ink. Accordingly, as can be determined by one of skill in the art, the high gloss coating ink and the low gloss coating ink are may be halftoned to produce a plurality of intermediate gloss levels corresponding to the relative percentages of the high and low gloss coating inks in the halftone cell.

During operations, the gloss controller is configured to receive gloss data as an input that identifies gloss levels for all or localized areas of an image receiving surface. The gloss data may include a single gloss level to be used to coat select areas of the surface, or the gloss data may include different gloss levels to be used to coat different areas of the image receiving surface. The gloss data may be received or input in any conventional manner. For example, gloss data may be included in the image data from the image data source. Alternatively, gloss data may be selectable via the user interface 22 of the image device. For example, the user interface may be equipped with push buttons, menus, lists, etc. that allows a user to select the desired gloss level for the coating. In addition, the user interface may be configured to allow a user to select or highlight the areas to receive particular gloss levels. Gloss levels may be identified by the percentages or densities of the respective gloss inks. For example, to select a high gloss coating, the user may select "100% high gloss." Similarly, to select an intermediate gloss coating, the user may select 50% high gloss/50% low glossy."

The gloss controller is configured to convert the gloss data into the appropriate halftone pattern for generating the gloss level corresponding to the gloss data. For example, the gloss controller may use the gloss data as a lookup key for accessing the data structure to retrieve the appropriate halftone pattern associated with the desired gloss level. Halftone patterns may be derived for each desired level of intermediate gloss in any suitable manner. For example, the halftone patterns may be determined empirically by printing test patches, examining the resulting gloss level output and storing the results in the memory. Once the appropriate halftone pattern is determined for a desired gloss level, the gloss controller actuates the appropriate inkjet nozzles of the printhead to eject the high gloss and/or low gloss coating inks in accordance with the halftone pattern.

Once the coating system has applied the selectable gloss coating to an image receiving surface, the gloss level of the coating may be measured by positioning a gloss meter adjacent to the media pathway downstream from the coating system. For example, referring to FIG. 1, the imaging device 10 may include a gloss meter 154 positioned adjacent the media pathway downstream from the coating system 100 to measure the gloss level on the printed media. The measured gloss level may be compared to the target gloss level to detect deviations in the gloss level from the target gloss level. Based on the differences between the target gloss level and the actual printed gloss level, the gloss controller 120 may dynamically adjust parameters of the coating system to maintain a consistent output.

With reference to FIG. 2, the coating modules 102 and/or the coating ink supplies 108, 110 of the coating system may be removable for storage outside the imaging device, and/or to enable swapping or replacing of the respective components. By configuring the coating modules 102 and coating ink supply sources 108, 110 as removable or replaceable, the range of gloss levels that are capable of being applied by the imaging device may be increased without increasing the size or complexity of the imaging device. To facilitate removal and/or replacement of the coating modules, the housing 170 of the coating modules may be configured for releasable connection to the print station of the imaging device in any suitable manner. Similarly, the coating ink supplies 108, 110 may be configured for releasable connection to the print station. The print station may include module positions or slots that are configured to releasably secure a coating module and/or a coating ink supply in an operable position in the print station. The housings or supports for separate coating modules or ink sources may be similarly sized so that the units may be swapped or replaced as needed.

When a coating module is removed from the imaging device, the module may be placed in a cleaning unit (not shown) which may be configured to purge the ink from the module. A printer user may put a new, clean coating module into the imaging device and program it for a particular gloss level while the previous module is being cleaned and purged. The cleaning unit configuration may have any suitable configuration and may contain solvents for pumping through the printhead. Once cleaned, a coating module may be used to apply the same gloss level coating or a different gloss level coating.

The coating system described above is useful in providing multiple selectable gloss coatings having substantially any desired level of gloss from high gloss (i.e., "glossy") to low gloss (i.e., matte or flat). In addition, the ability to produce various levels of gloss enable the ability to embed gloss images, or glossmarks, into a print that can be used as security or authenticity measures or for decorative or aesthetic purposes. The selectable gloss coating method may be extended to produce digitally addressable images in the gloss coating or to apply high or low gloss coating only in specific areas while offering image durability and protection over the entire page. The coating system may be configured to use more gloss coating inks than the high gloss and low gloss coating inks described above. For example, if one were to use four different gloss level inks, the four different gloss levels may be applied to a print media on pixel basis to create more continuous gradations in the gloss level of the coatings.

The coating system has been described with reference to a phase change inkjet printer; however, the coating system may also be used in other types of inkjet printers where one desires to be able to mix and print multiple gloss level coatings from a preloaded set of gloss inks. Accordingly, those skilled in the art will recognize that numerous modifications can be made to the specific implementations described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A method of operating an inkjet imaging device, the method comprising:

supplying a high gloss colorless coating ink having a first gloss level to a first group of inkjet nozzles;

supplying a low gloss colorless coating ink having a second gloss level to a second group of inkjet nozzles, the second gloss level being less than the first gloss level;

supplying a colored ink to a third group of inkjet nozzles;

ejecting the colored ink from the third group of inkjet nozzles to form an image on an image receiving member; and selectively actuating the first group and second group of inkjet nozzles to eject the high gloss and low gloss colorless coating inks onto the image receiving surface on which the image was formed, the colorless coating inks being ejected in accordance with a single halftone pattern to form a gloss coating on the image receiving surface, the single halftone pattern being an array of halftone cells, each halftone cell identifying whether a pixel to be formed on the image receiving member is formed with the high gloss colorless ink ejected from the first group of inkjet nozzles or with the low gloss colorless ink ejected from the second group of inkjet nozzles, the halftone cells in the single halftone pattern being used to operate the inkjet nozzles to generate a predetermined gloss level for the gloss coating.

2. The method of claim 1 further comprising:

retrieving the single halftone pattern from a plurality of halftone patterns stored in a memory.

3. The method of claim 1 wherein the single halftone pattern corresponds to a checkerboard pattern for ejection of the high gloss coating from the first group of inkjet nozzles and for ejection of the low gloss colorless ink coating from the second group of inkjet nozzles.

4. The method of claim 1 further comprising:

receiving gloss data; and the single halftone pattern used to form the gloss coating with the high gloss colorless ink coating and the low gloss colorless ink coating corresponds to the received gloss data.

5. The method of claim 4 wherein the gloss data correspond to a single gloss level.

6. The method of claim 4 wherein the gloss data correspond to a plurality of gloss levels, each gloss level being for a different area of the image receiving member.

7. The method of claim 4 further comprising:

generating the single halftone pattern with the received gloss data.

8. A method of operating an inkjet imaging device, the method comprising:

supplying a high gloss colorless coating ink having a first gloss level to a first group of inkjet nozzles;

supplying a low gloss colorless coating ink having a second gloss level to a second group of inkjet nozzles, the second gloss level being less than the first gloss level;

supplying a colored ink to a third group of inkjet nozzles;

ejecting the colored ink from the third group of inkjet nozzles to form an image on an image receiving member;

receiving gloss data;

generating a single halftone pattern with the gloss data, the single halftone pattern being an array of halftone cells, each halftone cell identifying whether a pixel to be printed is formed with a high gloss colorless ink to be ejected from a first group of inkjet nozzles or with a low gloss colorless ink ejected from a second group of inkjet nozzles; and selectively actuating the first group and second group of inkjet nozzles to eject the high gloss and low gloss colorless coating inks onto at least a portion of the image on the image receiving member, the colorless coating inks being ejected in accordance with the halftone cells in the single halftone pattern to form a gloss coating on the image receiving surface that corresponds to the gloss data.

9. The method of claim 8 wherein the gloss data correspond to a single gloss level.

10. The method of claim 8 wherein the gloss data correspond to a plurality of gloss levels, each gloss level being for a different area of the image receiving member.

11. The method of claim 8, the generation of the single halftone pattern further comprising:

retrieving with reference to the gloss data the single halftone pattern from a plurality of halftone patterns stored in a memory.

* * * * *